US010277196B2

(12) United States Patent
Khurshidjon et al.

(10) Patent No.: US 10,277,196 B2
(45) Date of Patent: Apr. 30, 2019

(54) BULK ACOUSTIC WAVE RESONATOR AND METHOD FOR MANUFACTURING THE SAME (71) Applicant: SAMSUNG ELECTRO-MECHANICS CO., LTD., Suwon-si (KR)

(72) Inventors: Khudoyberdiyev Khurshidjon, Suwon-si (KR); Duck Hwan Kim, Suwon-si (KR); Yeong Gyu Lee, Suwon-si (KR); Ho Joon Park, Suwon-si (KR); Moon Chul Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 370 days.

(21) Appl. No.: 14/994,848

(22) Filed: Jan. 13, 2016

(65) Prior Publication Data

US 2016/0315244 A1    Oct. 27, 2016

(30) Foreign Application Priority Data

Apr. 23, 2015 (KR) .................. 10-2015-0057503
Jun. 10, 2015 (KR) .................. 10-2015-0082073

(51) Int. Cl.
*H01L 41/107*      (2006.01)
*H03H 9/17*        (2006.01)
*H03H 3/02*        (2006.01)
*H03H 9/10*        (2006.01)

(52) U.S. Cl.
CPC .............. *H03H 9/17* (2013.01); *H03H 3/02* (2013.01); *H03H 9/1014* (2013.01); *H03H 9/173* (2013.01)

(58) Field of Classification Search
CPC .... H03H 9/173; H03H 9/0504; H03H 9/0509; H03H 9/0571; H03H 9/0585; H03H 9/1035; H01L 41/053
USPC .................................................. 310/348, 349
See application file for complete search history.

(56) References Cited

U.S. PATENT DOCUMENTS

2004/0135144 A1    7/2004  Yamada et al.
2006/0079785 A1*   4/2006  Hosono ............... A61B 8/4281
                                                 600/459
2007/0057599 A1*   3/2007  Motai ....................... H03H 3/02
                                                 310/324

(Continued)

FOREIGN PATENT DOCUMENTS

CN    102210035 A    10/2011
CN    103858342 A     6/2014

(Continued)

OTHER PUBLICATIONS

Chinese Office Action dated Apr. 4, 2018 in Chinese Patent Application No. 201610082339.X (12 pages in English, 8 pages in Chinese).

*Primary Examiner* — Bryan P Gordon
(74) *Attorney, Agent, or Firm* — NSIP Law (57) ABSTRACT

In examples, there is provided a bulk acoustic wave resonator including a substrate; a resonating part including a first electrode, a piezoelectric layer, and a second electrode, laminated on an upper surface of the substrate, a cap bonded to the substrate by a bonding agent; and a sealing layer formed on an externally exposed surface of the bonding agent. This structure provides for a bulk acoustic wave resonator with improved reliability.

19 Claims, 11 Drawing Sheets

(56) References Cited

U.S. PATENT DOCUMENTS

| | | | |
|---|---|---|---|
| 2008/0042524 A1* | 2/2008 | Shibata | H03H 3/04 |
| | | | 310/348 |
| 2008/0081398 A1 | 4/2008 | Lee et al. | |
| 2009/0224851 A1 | 9/2009 | Feiertag et al. | |
| 2010/0123369 A1* | 5/2010 | Ono | H03H 9/0519 |
| | | | 310/348 |
| 2011/0115036 A1* | 5/2011 | Moon | B81C 1/00269 |
| | | | 257/415 |
| 2011/0123369 A1* | 5/2011 | Oku | G01D 5/425 |
| | | | 417/375 |
| 2013/0147319 A1* | 6/2013 | Adkisson | H03H 9/173 |
| | | | 310/340 |
| 2014/0191825 A1* | 7/2014 | Son | H03H 9/02102 |
| | | | 333/189 |
| 2016/0021752 A1* | 1/2016 | Miyao | H05K 3/3463 |
| | | | 361/752 |

FOREIGN PATENT DOCUMENTS

| | | |
|---|---|---|
| JP | 2014-171116 A | 9/2014 |
| KR | 10-2008-0011676 A | 2/2008 |
| WO | WO 2010/077412 A1 | 7/2010 |
| WO | WO 2013/085136 A1 | 6/2013 |

\* cited by examiner

BULK ACOUSTIC WAVE RESONATOR AND METHOD FOR MANUFACTURING THE SAME

CROSS-REFERENCE TO RELATED APPLICATION(S)

This application claims the benefit under 35 USC 119(a) of Korean Patent Application Nos. 10-2015-0057503 filed on Apr. 23, 2015 and 10-2015-0082073 filed on Jun. 10, 2015 in the Korean Intellectual Property Office, the entire disclosures of which are incorporated herein by reference.

BACKGROUND

1. Field

The following description relates to a bulk acoustic wave resonator. The following description also relates to a method for manufacturing such a bulk acoustic wave resonator.

2. Description of Related Art

In accordance with the recent rapid development of mobile communications devices, and other related portable electronic device, demand for compact and lightweight filters, oscillators, resonant elements, acoustic resonant mass sensors, and other various components used to provide capabilities for such communications devices has also increased.

As a means for implementing the compact and lightweight filters, oscillators, resonant elements, acoustic resonant mass sensors, and so on, a film bulk acoustic resonator (FBAR) has been used. Such an FBAR has an advantage in that it may be mass-produced at minimal cost and may be subminiaturized. Further, such an FBAR has advantages in that it may allow a high value quality factor Q, which is a main performance property of a filter, to be implemented. Such an FBAR may operate at levels equal to those of the bands of a personal communications system (PCS) and a digital cordless system (DCS).

In general, the FBAR has a structure including a resonating part formed by sequentially laminating a first electrode, a piezoelectric layer, and a second electrode on a substrate.

An operational principle of such an FBAR is described further. First, when an electrical field is induced in the piezoelectric layer by applying electrical energy to the first and second electrodes, the electrical field causes a piezoelectric phenomenon in the piezoelectric layer. Such a piezoelectric phenomenon causes the resonating part to vibrate in a predetermined direction. As a result, bulk acoustic waves are generated in the same direction as the vibration direction of the resonating part, thereby causing a resonance phenomenon.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An aspect of the present disclosure may provide a bulk acoustic wave resonator capable of preventing moisture from permeating into the bulk acoustic wave resonator.

In one general aspect, a bulk acoustic wave resonator includes a substrate, a resonating part including a first electrode, a piezoelectric layer, and a second electrode, laminated on an upper surface of the substrate, a cap bonded to the substrate by a bonding agent, and a sealing layer formed on an externally exposed surface of the bonding agent.

The bulk acoustic wave resonator may further include a via hole penetrating through the substrate in a thickness direction of the substrate, and a connective conductor formed on an inner surface of the via hole and extending to a lower surface of the substrate.

The sealing layer and the connective conductor may be formed of a titanium (Ti)-copper (Cu) alloy.

The bulk acoustic wave resonator may further include an external electrode formed on the connective conductor on the lower surface of the substrate.

The sealing layer and the external electrode may be formed of a double layer of gold (Au)-nickel (Ni) metals.

Nickel (Ni) and gold (Au) may be sequentially laminated in the double layer of gold (Au)-nickel (Ni) metals.

A thickness of a metal layer of nickel (Ni) may be greater than a thickness of a metal layer of gold (Au) in the double layer of gold (Au)-nickel (Ni) metals.

The bonding agent may include a eutectic material of a copper (Cu)-tin (Sn) alloy.

In another general aspect, a method for manufacturing a bulk acoustic wave resonator includes forming a packaged bulk acoustic wave resonator by bonding a substrate wafer on which unit substrates are formed and a cap wafer on which a unit cap is formed to each other by a bonding agent, generating individual bulk acoustic wave resonators by dicing a boundary of the packaged bulk acoustic wave resonator, and forming a sealing layer on a surface of the externally exposed bonding agent of each of the individual bulk acoustic wave resonators.

During the generating of the bulk acoustic wave resonators, the boundary of the packaged bulk acoustic wave resonator may be half-cut diced, and during the forming of the sealing layer, the sealing layer may be formed on the surface of the externally exposed bonding agent of each of the individual bulk acoustic wave resonators.

In the forming of the sealing layer, the sealing layer may be formed to correspond to the surface of the externally exposed bonding agent of each of the individual bulk acoustic wave resonators.

During the forming of the sealing layer, the sealing layer may be formed on an overall surface cut by the dicing.

The method may further include forming a via hole in each of the unit substrates, and forming a connective conductor extended from an inner surface of the via hole to a lower surface of the unit substrate, wherein the forming of the connective conductor and the forming of the sealing layer are performed simultaneously.

The sealing layer and the connective conductor may be formed by depositing titanium (Ti)-copper (Cu) alloy.

The method may further include forming an external electrode on the connective conductor on the lower surface of the substrate, wherein the forming of the external electrode and the forming of the sealing layer are performed simultaneously.

The external electrode and the sealing layer may be formed by sequentially depositing gold (Au) and nickel (Ni) metal layers.

A thickness of a metal layer of nickel (Ni) may be greater than a thickness of a metal layer of gold (Au) in the gold (Au) and nickel (Ni) metal layers.

The bonding agent may include a eutectic material of a copper (Cu)-tin (Sn) alloy.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, examples are described in further detail with reference to the accompanying drawings.

Figure 1:
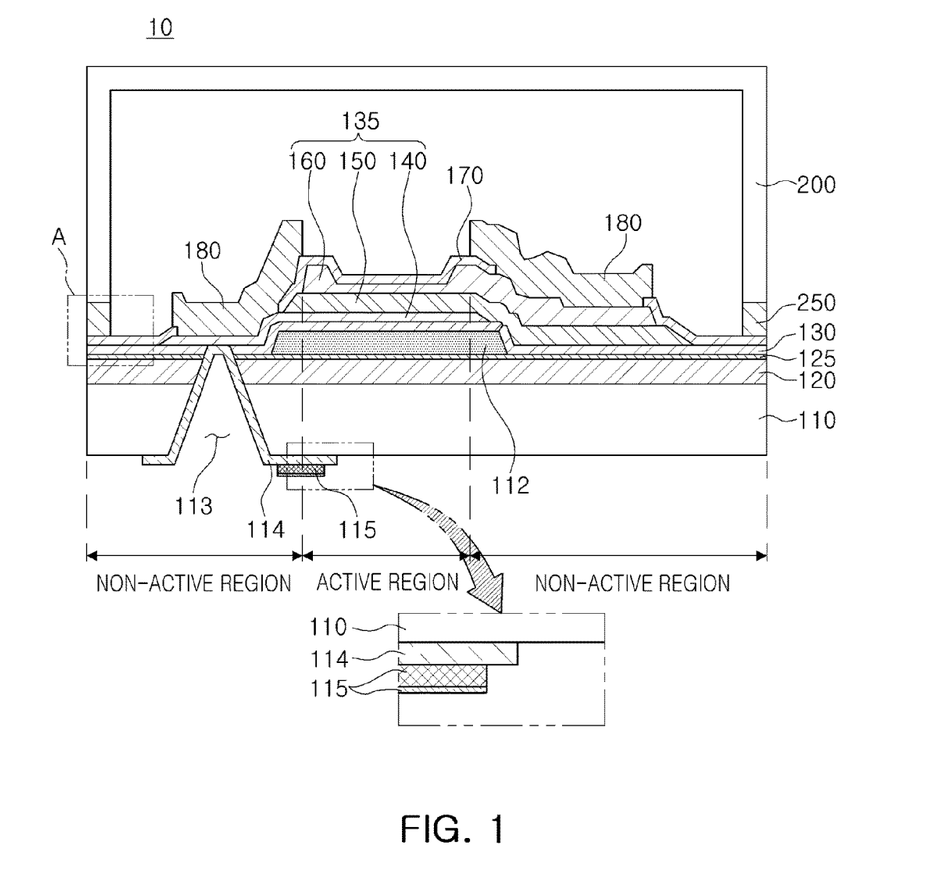
FIG. 1 is a cross-sectional view of a bulk acoustic wave resonator according to an example.

FIG. 1 is a cross-sectional view of a bulk acoustic wave resonator according to an example.

Referring to the example of FIG. 1, a bulk acoustic wave resonator 10 according to an example is a film bulk acoustic resonator (FBAR) and includes a substrate 110, an insulating layer 120, an air cavity 112, and a resonating part 135.

Referring to the example of FIG. 1, the bulk acoustic wave resonator 10 according to an example includes the substrate 110, the insulating layer 120, the air cavity 112, and the resonating part 135.

For example, the substrate 110 is formed of a typical silicon substrate. The insulating layer 120 that electrically insulates the resonating part 135 from the substrate 110 is possibly formed on an upper surface of the substrate 110. For example, the insulating layer 120 is formed by depositing silicon dioxide ($SiO_2$) or aluminum oxide ($Al_2O_3$) on the substrate 110 using a chemical vapor deposition process, an RF magnetron sputtering method, or an evaporation method. However, these methods are only example and other methods and processes are potentially used in other examples.

In such an example, at least one via hole 113 that penetrates through the substrate 110 in a thickness direction of the substrate 110 is formed in a lower surface of the substrate 110. Accordingly, a connective conductor 114 is formed in the via hole 113. In such an example, the connective conductor 114 is formed on an inner surface of the via hole 113, that is, an overall inner wall of the via hole 113. However, examples are not limited to this particular example and other examples provide for certain appropriate variation in the placement of the connective conductor 114.

In examples, the connective conductor 114 is manufactured by forming a conductive layer on the inner surface of the via hole 113. For example, the connective conductor 114 is formed by depositing, coating, or filling a conductive metal such as gold (Au) or copper (Cu) along the inner wall of the via hole 113. These are only examples of conductive metals, and other appropriate metals or alloys are used in other examples.

As an example, the connective conductor 114 is manufactured of a titanium (Ti)-copper (Cu) alloy.

One end of the connective conductor 114 is extended toward the lower surface of the substrate 110, and an external electrode 115 is formed on the connective conductor 114 on the lower surface of the substrate 110.

Here, the external electrode 115 is formed by depositing a metal. In an example, the deposited metal is a double layer of a gold (Au)-nickel (Ni) material, but other appropriate metals and alloys are used in other examples. For example, the metal is deposited by using an electroless plating process. Electroless plating, also known as chemical or autocatalytic plating, is a non-galvanic plating method that involves several simultaneous reactions in an aqueous solution, which occur without the use of external electrical power. Here, in an example, a thickness of nickel (Ni) among the double layer of gold (Au)-nickel (Ni) material is thicker than that of gold (Au). For example, the thickness of nickel (Ni) is 4 μm and the thickness of gold (Au) may be 0.05 μm. Here, after the metal layer of nickel (Ni) is formed on the connective conductor 114, the metal layer of gold (Au) is formed on the metal layer of nickel (Ni).

In this example, the other end of the connective conductor 114 is connected to a first electrode 140. Here, the connective conductor 114 is electrically connected to the first electrode 140 so as to penetrate through the substrate 110 and a membrane 130. As a result, the connective conductor 114 electrically connects the first electrode 140 and the external electrode 115 to each other.

FIG. 1 illustrates only one via hole 113, one connective conductor 114, and one external electrode 115. However, the number of via holes 113, connective conductors 114, and external electrodes 115 is not limited to one, and other instances of these elements are present in other examples. For example, a large number of via holes 113, connective conductors 114, and external electrodes 115 are provided if appropriate to a given example. For example, the via hole 113, the connective conductor 114, and the external electrode 115 may also be formed to electrically connect to the second electrode 160.

In this example, the air cavity 112 is located above the insulating layer 120. Also, the air cavity 112 is located below the resonating part 135 so that the resonating part 135 is able to be vibrated in a predetermined direction. The air cavity 112 is formed by processes of forming an air cavity scarification layer pattern on the insulating layer 120, then forming a membrane 130 on the air cavity scarification layer pattern, and then etching and removing the air cavity scarification layer pattern. After these steps, the air cavity 112 remains.

In such an example, an etch stop layer 125 is further formed between the insulating layer 120 and the air cavity 112. Here, the etch stop layer 125 serves to protect the substrate 110 and the insulating layer 120 from an etching process and also serves as a base that is used to deposit various other layers on the etch stop layer 125.

Here, the air cavity 112 is formed by processes of forming an air cavity scarification layer pattern on the insulating layer 120, then forming a membrane 130 on the air cavity scarification layer pattern, and then etching and removing the air cavity scarification layer pattern. The membrane 130 serves as an oxidation protection layer and/or serves as a protection layer protecting the substrate 110.

In this example, the resonating part 135 includes a first electrode 140, a piezoelectric layer 150, and a second electrode 160, sequentially laminated so as to be located above the air cavity 112.

The first electrode 140 is formed on an upper surface of the membrane 130 so as to cover a portion of the membrane 130. In an example, the first electrode 140 is formed of a typical conductive material such as a metal. Specifically, the first electrode 140 is possibly formed of gold (Au), titanium (Ti), tantalum (Ta), molybdenum (Mo), ruthenium (Ru), platinum (Pt), tungsten (W), aluminum (Al), or nickel (Ni). However, these are merely examples and it is possible to form the first electrode 140 out of another appropriate metallic material.

The piezoelectric layer 150 is formed on upper surfaces of the membrane 130 and the first electrode 140 so as to cover a portion of the membrane 130 and a portion of the first electrode 140. The piezoelectric layer 150 acts as a part that generates a piezoelectric effect by converting electrical energy into mechanical energy of an acoustic wave type. For example, the piezoelectric layer 150 is formed of aluminum nitride (AlN), zinc oxide (ZnO), lead zirconium titanium oxide (PZT; PbZrTiO), or another similar appropriate material with appropriate piezoelectric characteristics.

Also, the second electrode 160 is formed on the piezoelectric layer 150. In a similar manner to the first electrode 140, the second electrode 160 is possibly formed of a conductive material such as gold (Au), titanium (Ti), tantalum (Ta), molybdenum (Mo), ruthenium (Ru), platinum (Pt), tungsten (W), aluminum (Al), or nickel (Ni). However, these are merely examples and it is possible to form the second electrode 160 out of another appropriate metallic material.

The resonating part 135 is classified as having an active region and non-active regions. The active region of the resonating part 135 is a region that vibrated in a predetermined direction by a piezoelectric phenomenon in order to create resonance when electrical energy is applied to the first and second electrodes 140 and 160 to induce an electrical field in the piezoelectric layer 150. In an example, the active region of the resonating part 135 corresponds to a region in which the first electrode 140, the piezoelectric layer 150, and the second electrode 160 overlap with each other in a vertical direction above the air cavity 112. The non-active regions of the resonating part 135, which are regions not resonated by the piezoelectric phenomenon, even in an example where electrical energy is applied to the first and second electrodes 140 and 160, potentially correspond to outer regions of the active region.

The resonating part 135 having the configuration as described above filters an RF signal of a specific frequency using the piezoelectric effect of the piezoelectric layer 150, as described above. That is, the RF signal applied to the second electrode 160 is output toward the first electrode 140 through the resonating part 135. In this example, since the resonating part 135 has a constant resonance frequency according to the vibrations occurring in the piezoelectric layer 150, the resonating part 135 only outputs a signal matched to the resonance frequency of the resonating part 135 among the applied RF signals.

The protection layer 170 is located on the second electrode 160 of the resonating part 135 so as to prevent the second electrode 160 from being exposed externally. For example, the protection layer 170 is formed of an insulating material. Here, examples of the insulating material include a silicon oxide-based material, a silicon nitride-based material, and an aluminum nitride-based material. However, these are merely examples and other appropriate insulating materials are used in other examples.

In this example, connection electrodes 180 are formed above the first electrode 140 and the second electrode 160 on the non-active regions, and penetrate through the protection layer 170 so as to be bonded to the first electrode 140 and the second electrode 160. The connection electrodes 180 are provided to confirm filter characteristics of the resonator and perform a required frequency trimming. However, the functions of the connection electrodes 180 are not limited thereto, and the connection electrodes 180 optionally have other roles in other examples.

In one example, a cap 200 is bonded to the substrate 110 to protect the resonating part 135 from an external environment.

In this example, the cap 200 is formed to have a cover form including an internal space in which the resonating part 135 is accommodated. Specifically, the cap 200 has a groove portion formed in its center so that the resonating part 135 is accommodated inside, and a frame of the cap 200 is formed to be stepped as compared to the groove portion so as to be coupled to the resonator at the edge of the resonator. In examples, the frame is directly or indirectly bonded to the substrate 110 through a bonding agent 250 in a specific region. Although FIG. 1 illustrates an example in which the frame is bonded to the protection layer 170 laminated on the substrate 110, the frame is also possibly bonded to at least one of the membrane 130, the etch stop layer 125, the insulating layer 120, and the substrate 110 by penetrating through the protection layer 170.

In an example, the cap 200 is formed by a wafer bonding at a wafer level. That is, a substrate wafer on which a plurality of unit substrates 110 are formed, and a cap wafer on which a plurality of unit caps 200 are formed are bonded to each other to be integrally formed as bonded wafers. The substrate wafer and the cap wafer, which are then bonded to each other, are subsequently cut in a cutting process so as to be divided into a plurality of individual bulk acoustic wave resonators as illustrated in FIG. 1.

The cap 200 according to an example is bonded to the substrate 110 by eutectic bonding. Eutectic bonding is a wafer bonding technique using an intermediate metal layer that can produce a eutectic system. Those eutectic metals are alloys that transform directly from solid to liquid state, or vice versa from liquid to solid state, at a specific composition and temperature without passing a two-phase equilibrium, i.e. liquid and solid state. In this case, after the bonding agent 250, which is eutectic-bonded to the substrate 110, is deposited on the substrate 110, the substrate wafer and the cap wafer are pressurized and heated to be bonded to each other.

In such an example, the bonding agent 250 potentially includes a eutectic material such as a copper (Cu)-tin (Sn) alloy, and also possibly includes a solder ball.

Figure 2:
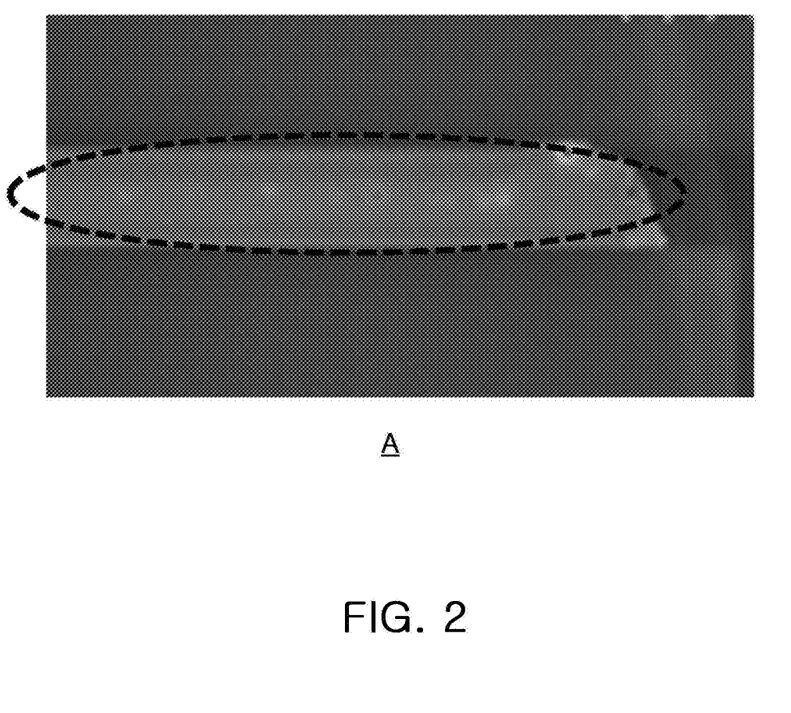
FIG. 2 is a partially-enlarged view of the bulk acoustic wave resonator according to the example illustrated in FIG. 1.

FIG. 2 is a partially-enlarged view of the bulk acoustic wave resonator according to the example illustrated in FIG. 1, and in particular, is an enlarged view of a region A of FIG. 1.

Specifically, FIG. 2 illustrates a partially-enlarged view of a bonding region of the substrate 110 and the cap 200. Referring to FIG. 2, it is observable that micropores are present in the bonding agent 250 that is present in the bonding region. In the example in which the above-mentioned micropores are present in the bonding region, moisture or similar environmental influences potentially permeate into the bonding region, which results in a problem that the reliability of the bulk acoustic wave resonator is not secured.

Figure 3A:
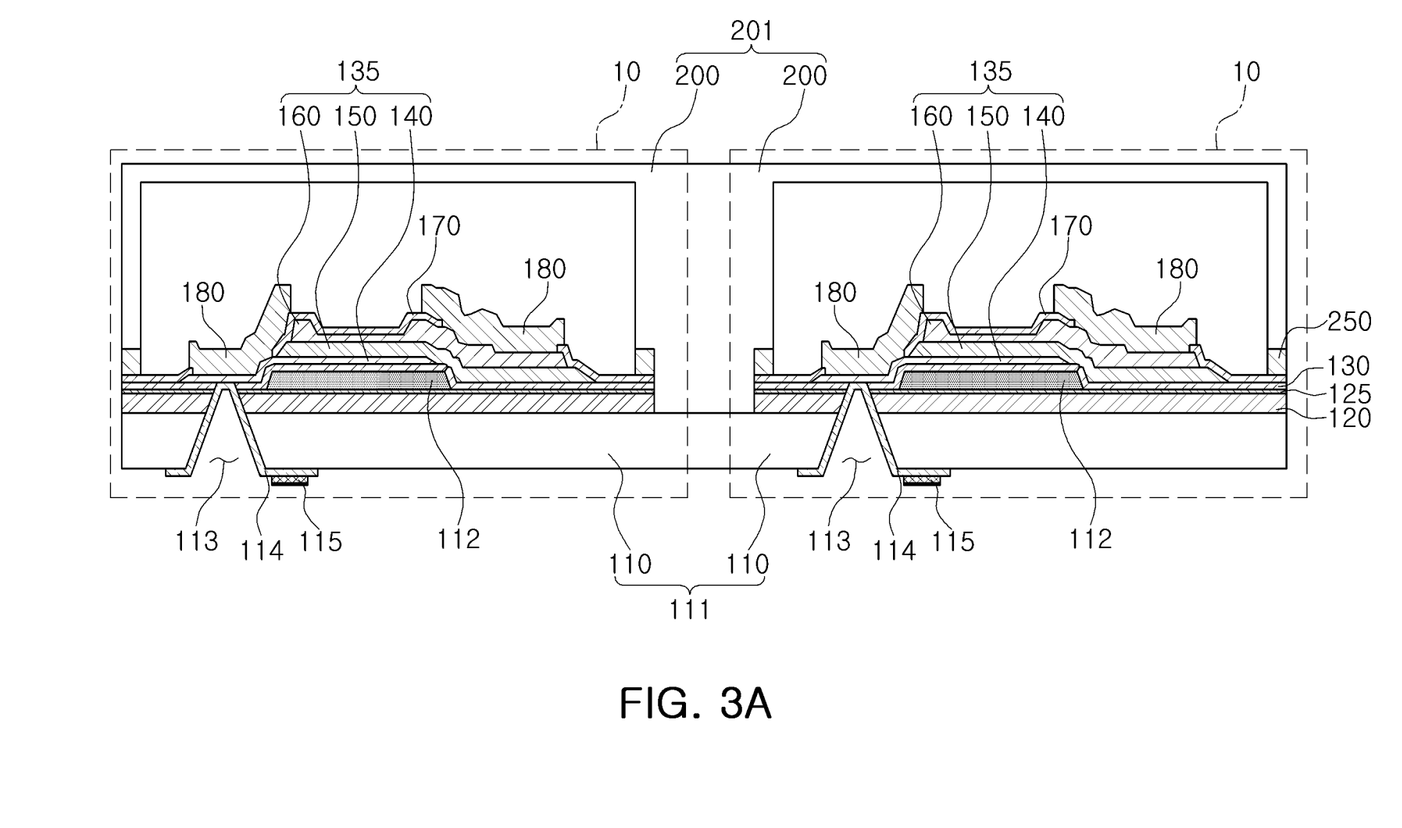
FIGS. 3A through 3C are diagrams illustrating a process of manufacturing a bulk acoustic wave resonator according to an example.
Figure 3B:
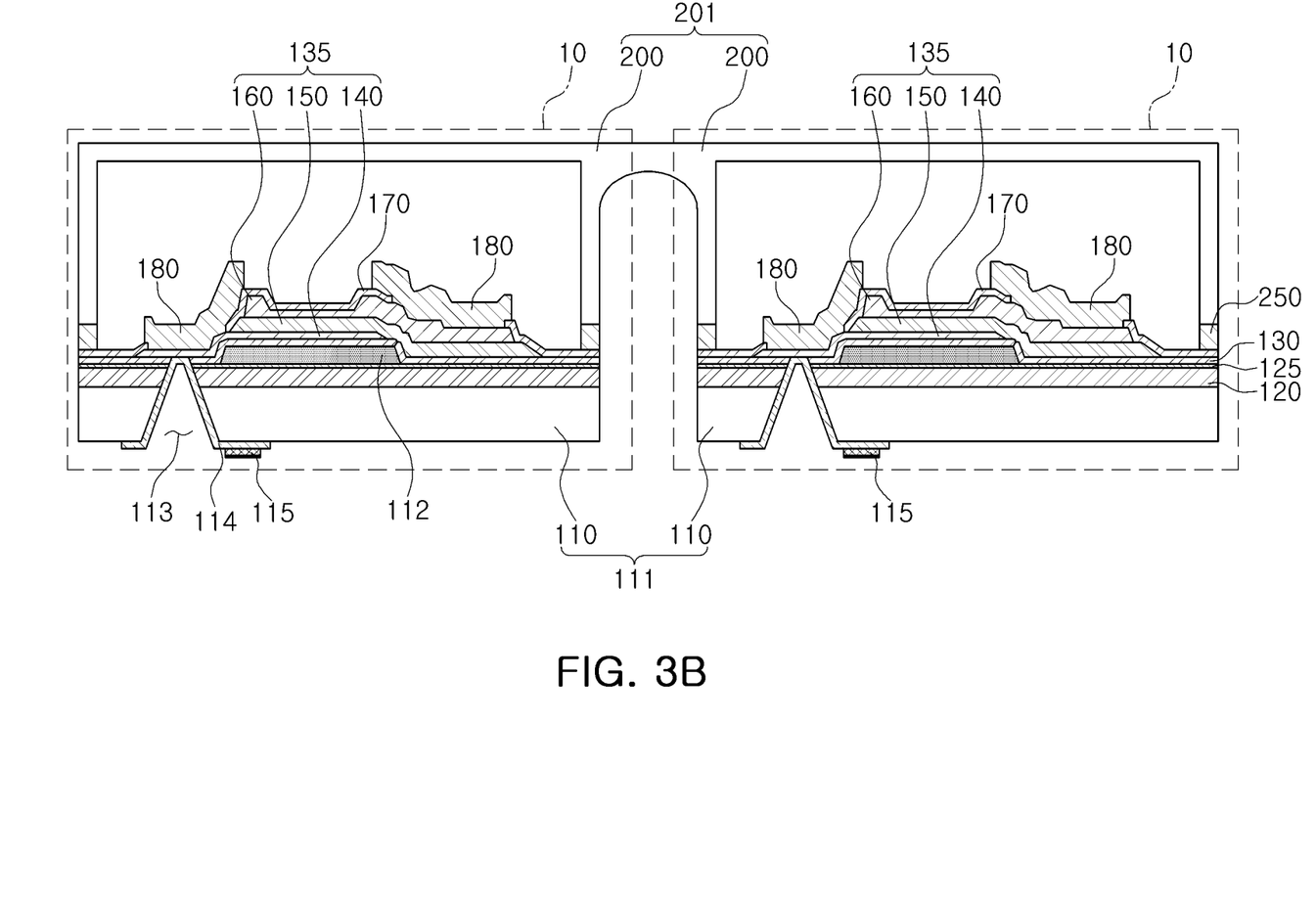
Figure 3C:
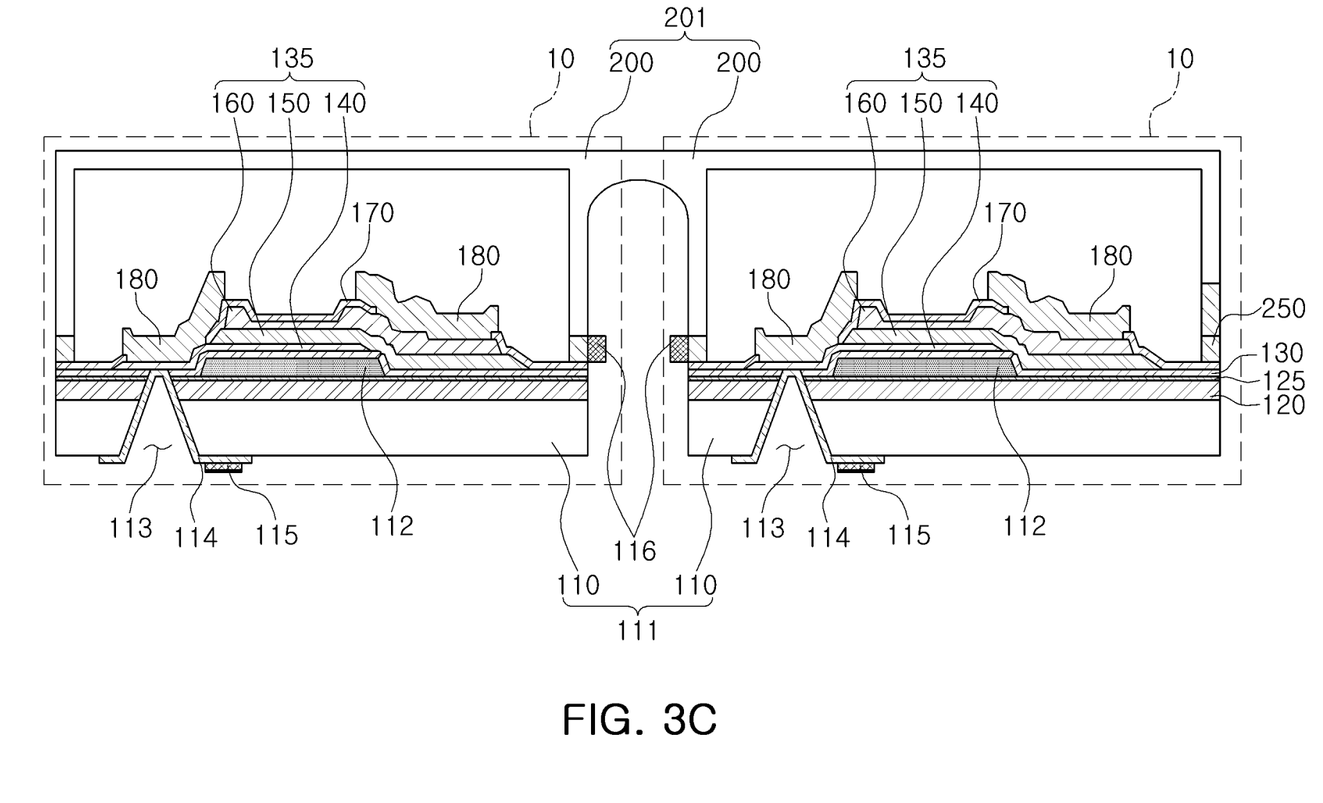

FIGS. 3A through 3C are diagrams illustrating a process of manufacturing a bulk acoustic wave resonator according to an example. Referring to the examples of FIGS. 3A through 3C, it is observable that a substrate wafer 111 on which a plurality of individual substrates 110 of FIG. 1 are formed, that is, the substrate wafer on which a plurality of resonating parts 135 are located, and a cap wafer 201 on which a plurality of caps are disposed are located to be bonded to each other. These examples schematically illustrate a plurality of bulk acoustic wave resonators that are simultaneously manufactured on the wafer level, before they are divided into individual bulk acoustic wave resonators.

Referring to the example of FIG. 3A, the plurality of bulk acoustic wave resonators are manufactured on the substrate wafer 111 having a large area formed of a separate substrate material. The substrate wafer 111 having the large area and the cap wafer 201 are bonded to each other using the bonding agent 250. The substrate wafer 111 and the cap wafer 201, which are bonded to each other, are referred to as a packaged bulk acoustic wave resonator.

Referring to FIG. 3B, a portion or all of the bulk acoustic wave resonator of the wafer level illustrated in FIG. 3A, that is, the packaged bulk acoustic wave resonator, is cut by a half-cut dicing or cut dicing approach. Here, the bonding agent 250 is exposed externally by the half-cut dicing. In an example, the half-cut dicing cuts the bulk acoustic wave resonator of the wafer level to 100 µm or less.

As described above, the micropores are formed in the bonding agent 250. Accordingly, the above-mentioned micropores deteriorate reliability of the bulk acoustic wave resonator.

Referring to the example of FIG. 3C, a sealing layer 116 is formed on a surface of the bonding agent 250 that is exposed externally of each of the plurality of individual bulk acoustic wave resonators 10. In such an example, the sealing layers 116 are simultaneously formed on the plurality of individual bulk acoustic wave resonators.

According to an example, the process of manufacturing the bulk acoustic wave resonator is simplified by simultaneously forming the sealing layers 116 on the plurality of individual bulk acoustic wave resonators 10.

FIGS. 4A through 4F are diagrams illustrating a sealing layer that is formed on a surface of a bonding agent exposed externally of the bulk acoustic wave resonator in detail. Hereinafter, the configuration of the sealing layer 116 and a method for manufacturing the sealing layer 116 are described in further detail with reference to the examples of FIGS. 4A through 4F.

Figure 4A:
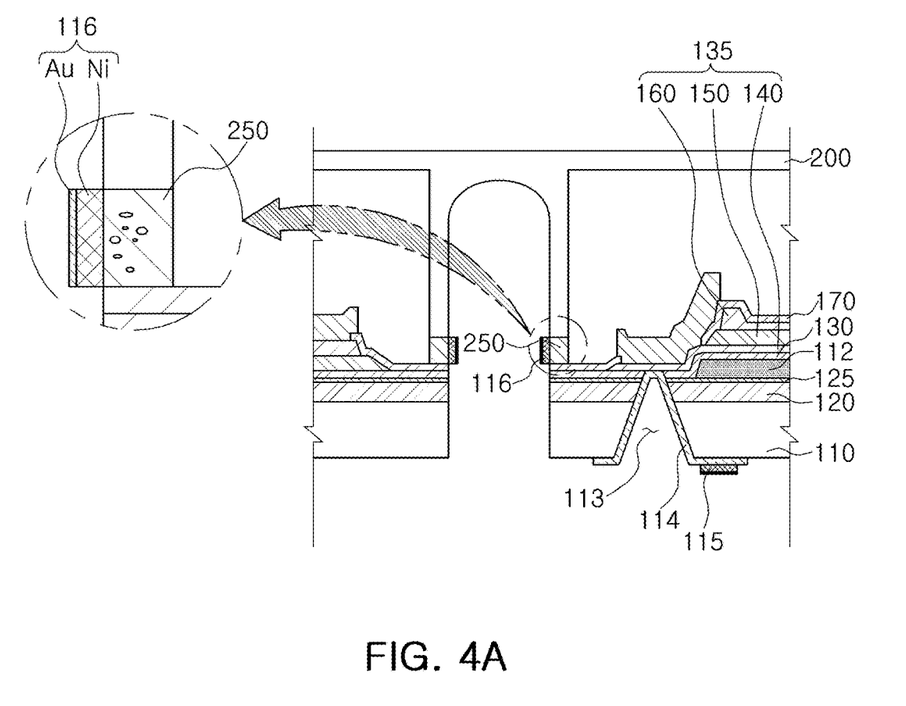
FIGS. 4A through 4F are diagrams illustrating a sealing layer formed on a surface of a bonding agent exposed externally of the bulk acoustic wave resonator in further detail.
Figure 4B:
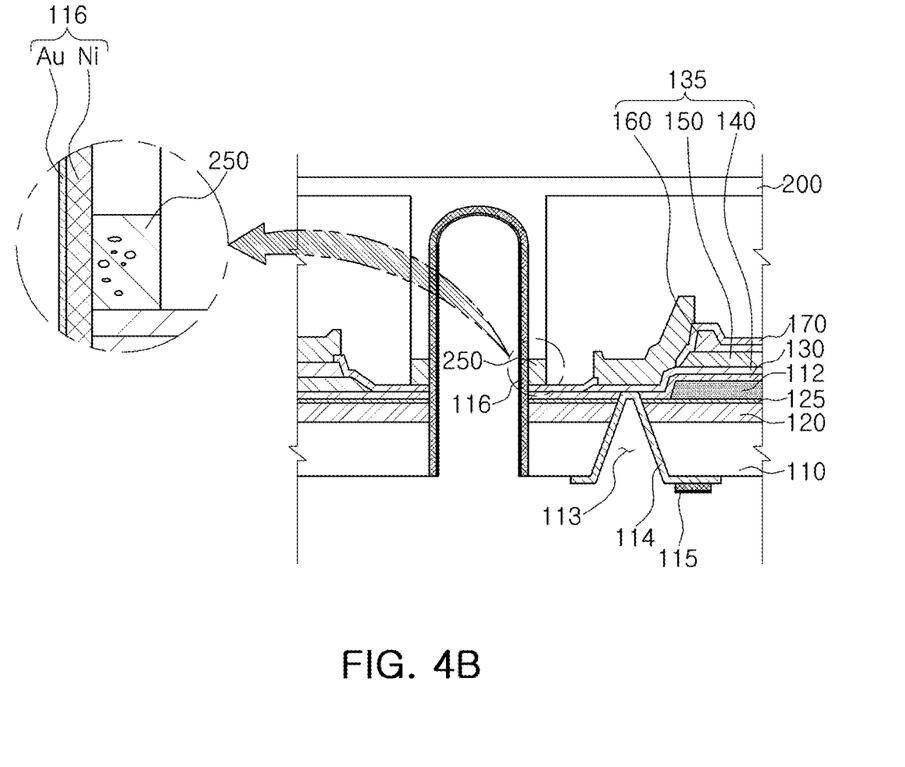

First, referring to the examples of FIGS. 4A and 4B, the sealing layer 116 corresponds to a surface region of the bonding agent 250 exposed externally of the bulk acoustic wave resonator, as shown in FIG. 4A, and the sealing layer 116 is formed on an overall cut surface between the individual bulk acoustic wave resonators, as shown in FIG. 4B.

In this example, the external electrode 115 and the sealing layer 116 are formed by the same process, such that a material forming the sealing layer 116 is the same material as the material forming the external electrode 115. As a result, similarly to the metal material forming the external electrode 115, a metal material forming the sealing layer 116 is also the double layer of gold (Au)-nickel (Ni) metal layers. Here, after the metal layer of nickel (Ni) is formed, the metal layer of gold (Au) is formed on the metal layer of nickel (Ni).

For example, the double layer of gold (Au)-nickel (Ni) is deposited by using an electroless plating process as discussed above, thereby forming the external electrode 115 and the sealing layer 116. Here, in such an example, a thickness of nickel (Ni) among the double layer of gold (Au)-nickel (Ni) is 4 µm and a thickness of gold (Au) is 0.05 µm.

Figure 4C:
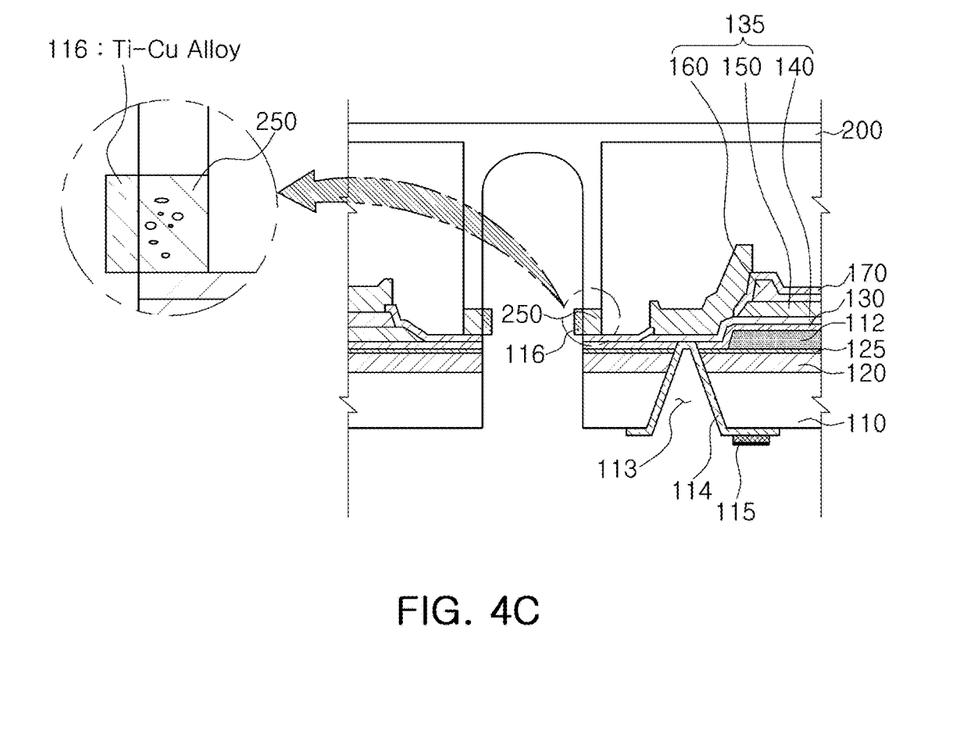
Figure 4D:
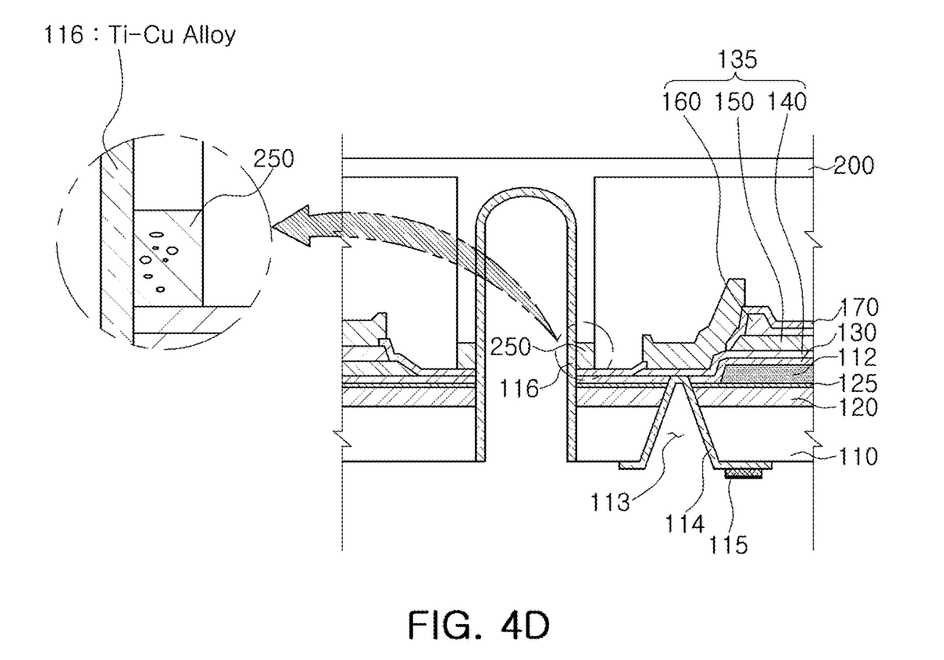

Next, referring to the examples of FIGS. 4C and 4D, the sealing layer 116 corresponds to a surface region of the bonding agent 250 exposed externally of the bulk acoustic wave resonator, as shown in FIG. 4C, and the sealing layer 116 is formed on an overall cut surface between the individual bulk acoustic wave resonators, as shown in FIG. 4D.

Hence, the connective conductor 114 and the sealing layer 116 are formed by the same process, such that a material forming the sealing layer 116 is the same material as the material forming the connective conductor 114. As a result, similarly to the metal material forming the connective conductor 114, a metal material forming the sealing layer 116 is also a titanium (Ti)-copper (Cu) alloy.

In this example, the titanium (Ti)-copper (Cu) alloy is deposited by using the electroless plating process, and accordingly forming the connective conductor 114 and the sealing layer 116.

Figure 4E:
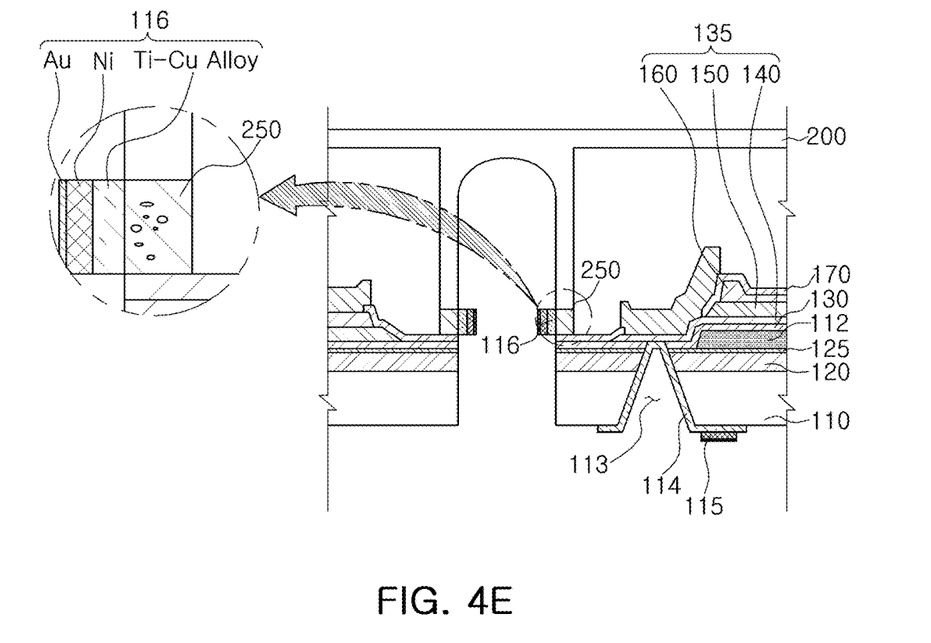
Figure 4F:
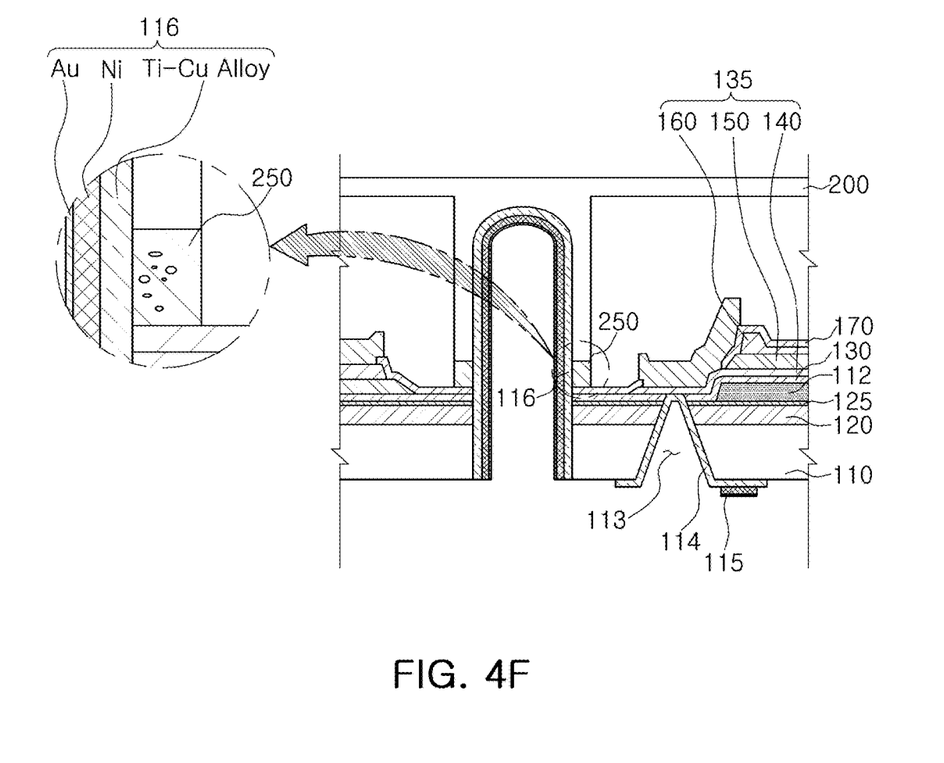

Next, referring to the examples of FIGS. 4E and 4F, the sealing layer 116 corresponds to a surface region of the bonding agent 250 exposed externally of the bulk acoustic wave resonator, as shown in FIG. 4E, and the sealing layer 116 is formed on an overall cut surface between the individual bulk acoustic wave resonators, as shown in FIG. 4F.

A material forming the sealing layer 116 is the same material as the material forming the connective conductor 114 and the external electrode 115. Also, the sealing layer 116 is formed by the same process as the process of forming the connective conductor 114 and the external electrode 115. Accordingly, a metal material forming the sealing layer 116 has a form in which the titanium (Ti)-copper (Cu) alloy forming the connective conductor 114 and the double layer of gold (Au)-nickel (Ni) forming the external electrode 115 are sequentially laminated.

Also, in this example, after the titanium (Ti)-copper (Cu) alloy is deposited by using the electroless plating process, the double layer of gold (Au)-nickel (Ni) is deposited by using the electroless plating process.

According to an example, the sealing layer 116 is formed by depositing the metal material on the surface of the bonding agent 250 exposed externally of the bulk acoustic wave resonator or the overall cut inner surface of the bulk acoustic wave resonator by using the process of forming the connective conductor 114 and/or the external electrode 115 without involving a separate process. As a result, reliability of the bulk acoustic wave resonator is improved.

As set forth above, according to the exemplary embodiments in the present disclosure, the permeation of moisture into the bulk acoustic wave resonator is prevented, whereby reliability may be secured.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation, Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator comprising:
   a substrate;
   a resonating part comprising a first electrode, a piezoelectric layer, and a second electrode, laminated on an upper surface of the substrate;
   a cap bonded to the substrate by a bonding agent;
   a sealing layer formed on an externally exposed surface of the bonding agent; and
   at least one of a connective conductor and an external electrode disposed as a same layer as the sealing layer, wherein the sealing layer is spaced apart and insulated from the at least one of the connective conductor and the external electrode.

2. The bulk acoustic wave resonator of claim 1, further comprising:
   a via hole penetrating through the substrate in a thickness direction of the substrate; and
   the connective conductor formed on an inner surface of the via hole and extending to a lower surface of the substrate.

3. The bulk acoustic wave resonator of claim 2, wherein the sealing layer and the connective conductor are formed of a titanium (Ti)-copper (Cu) alloy.

4. The bulk acoustic wave resonator of claim 2, further comprising-the external electrode formed on the connective conductor on the lower surface of the substrate.

5. The bulk acoustic wave resonator of claim 4, wherein the sealing layer and the external electrode are formed of a double layer of gold (Au)-nickel (Ni) metals.

6. The bulk acoustic wave resonator of claim 5, wherein nickel (Ni) and gold (Au) are sequentially laminated in the double layer of gold (Au)-nickel (Ni) metals.

7. The bulk acoustic wave resonator of claim 5, wherein a thickness of a metal layer of nickel (Ni) is greater than a thickness of a metal layer of gold (Au) in the double layer of gold (Au)-nickel (Ni) metals.

8. The bulk acoustic wave resonator of claim 1, wherein the bonding agent comprises a eutectic material of a copper (Cu)-tin (Sn) alloy.

9. A method for manufacturing the bulk acoustic wave resonator of claim 1, the method comprising:
   forming a packaged bulk acoustic wave resonator by bonding a substrate wafer on which unit substrates are formed and a cap wafer on which a unit cap is formed to each other by a bonding agent;
   generating individual bulk acoustic wave resonators by dicing a boundary of the packaged bulk acoustic wave resonator; and
   forming a sealing layer on a surface of the externally exposed bonding agent of each of the individual bulk acoustic wave resonators.

10. The method of claim 9, wherein during the generating of the bulk acoustic wave resonators, the boundary of the packaged bulk acoustic wave resonator is half-cut diced, and
   during the forming of the sealing layer, the sealing layer is formed on the surface of the externally exposed bonding agent of each of the individual bulk acoustic wave resonators.

11. The method of claim 9, wherein in the forming of the sealing layer, the sealing layer is formed to correspond to the surface of the externally exposed bonding agent of each of the individual bulk acoustic wave resonators.

12. The method of claim 9, wherein during the forming of the sealing layer, the sealing layer is formed on an overall surface cut by the dicing.

13. The method of claim 9, further comprising:
   forming a via hole in each of the unit substrates; and
   forming a connective conductor extended from an inner surface of the via hole to a lower surface of the unit substrate,
   wherein the forming of the connective conductor and the forming of the sealing layer are performed simultaneously.

14. The method of claim 13, wherein the sealing layer and the connective conductor are formed by depositing titanium (Ti)-copper (Cu) alloy.

15. The method of claim 13, further comprising forming an external electrode on the connective conductor on the lower surface of the substrate,
   wherein the forming of the external electrode and the forming of the sealing layer are performed simultaneously.

16. The method of claim 15, wherein the external electrode and the sealing layer are formed by sequentially depositing gold (Au) and nickel (Ni) metal layers.

17. The method of claim 16, wherein a thickness of a metal layer of nickel (Ni) is greater than a thickness of a metal layer of gold (Au) in the gold (Au) and nickel (Ni) metal layers.

18. The method of claim 9, wherein the bonding agent comprises a eutectic material of a copper (Cu)-tin (Sn) alloy.

19. The bulk acoustic wave resonator of claim 1, wherein the sealing layer and the at least one of the connective conductor and the external electrode are formed of the same material.

* * * * *